United States Patent
Lenniger et al.

(10) Patent No.: US 8,963,321 B2
(45) Date of Patent: Feb. 24, 2015

(54) SEMICONDUCTOR DEVICE INCLUDING CLADDED BASE PLATE

(71) Applicant: Infineon Technologies AG, Neubiberg (DE)

(72) Inventors: Andreas Lenniger, Anroechte (DE); Andre Uhlemann, Dortmung (DE); Olaf Hohlfeld, Warstein (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/749,006

(22) Filed: Jan. 24, 2013

(65) Prior Publication Data
US 2013/0134572 A1 May 30, 2013

Related U.S. Application Data

(63) Continuation-in-part of application No. 13/230,223, filed on Sep. 12, 2011, now Pat. No. 8,159,532.

(51) Int. Cl.
*H01L 23/34* (2006.01)
*H01L 23/48* (2006.01)
(Continued)

(52) U.S. Cl.
CPC .......... *H01L 23/367* (2013.01); *H01L 23/3677* (2013.01); *H01L 21/50* (2013.01); *H01L 23/473* (2013.01); *H01L 24/40* (2013.01); *H01L 24/48* (2013.01); *H01L 25/072* (2013.01); *H01L 2924/1301* (2013.01);
(Continued)

(58) Field of Classification Search
USPC ................. 257/694, 772, 712–722, 257/E23.101–E23.105, E23.08, E23.01, 257/E23.077, E23.082, E23.098, E23.099; 438/121, 122
See application file for complete search history.

(56) References Cited

U.S. PATENT DOCUMENTS 5,966,291 A  10/1999  Baumel et al.
7,900,692 B2  3/2011  Miyahara
(Continued)

FOREIGN PATENT DOCUMENTS

DE      19719703       11/1998
DE      202004009244    8/2004
(Continued)

OTHER PUBLICATIONS

"Advanced Packaging Yields Higher Performance and Reliability in Power Electronics", Dr. Reinhold Bayerer, et al., Infineon Technologies AG, 2010 (6 pgs.).
(Continued)

*Primary Examiner* — Julio J Maldonado
*Assistant Examiner* — Cory Eskridge
(74) *Attorney, Agent, or Firm* — Dicke, Billig & Czaja, PLLC (57) ABSTRACT

A semiconductor device includes a semiconductor chip joined with a substrate and a base plate joined with the substrate. The base plate includes a first metal layer clad to a second metal layer. The second metal layer is deformed to provide a pin-fin or fin cooling structure. The second metal layer has a sub-layer that has no pins and no pin-fins. The first metal layer has a first thickness and the sub-layer has a second thickness. The ratio between the first thickness and the second thickness is at least 4:1.

35 Claims, 8 Drawing Sheets

(51) Int. Cl.
- *H01L 23/52* (2006.01)
- *H01L 21/00* (2006.01)
- *H01L 23/367* (2006.01)
- *H01L 21/50* (2006.01)
- *H01L 23/473* (2006.01)
- *H01L 23/00* (2006.01)
- *H01L 25/07* (2006.01)
- *H01L 23/24* (2006.01)
- *H01L 23/373* (2006.01)
- *H01L 23/31* (2006.01)
- *H01L 23/40* (2006.01)

(52) U.S. Cl.
CPC ...... *H01L 2224/40227* (2013.01); *H01L 23/24* (2013.01); *H01L 23/3735* (2013.01); *H01L 23/3736* (2013.01); *H01L 24/32* (2013.01); *H01L 24/37* (2013.01); *H01L 24/45* (2013.01); *H01L 24/73* (2013.01); *H01L 24/85* (2013.01); *H01L 2224/32225* (2013.01); *H01L 2224/32227* (2013.01); *H01L 2224/32245* (2013.01); *H01L 2224/37147* (2013.01); *H01L 2224/45124* (2013.01); *H01L 2224/45144* (2013.01); *H01L 2224/45147* (2013.01); *H01L 2224/48132* (2013.01); *H01L 2224/48139* (2013.01); *H01L 2224/48227* (2013.01); *H01L 2224/48472* (2013.01); *H01L 2224/48599* (2013.01); *H01L 2224/48699* (2013.01); *H01L 2224/73263* (2013.01); *H01L 2224/73265* (2013.01); *H01L 2224/85205* (2013.01); *H01L 2924/01005* (2013.01); *H01L 2924/01006* (2013.01); *H01L 2924/01012* (2013.01); *H01L 2924/01013* (2013.01); *H01L 2924/01019* (2013.01); *H01L 2924/01029* (2013.01); *H01L 2924/01047* (2013.01); *H01L 2924/0105* (2013.01); *H01L 2924/01051* (2013.01); *H01L 2924/01068* (2013.01); *H01L 2924/01079* (2013.01); *H01L 2924/01082* (2013.01); *H01L 2924/01327* (2013.01); *H01L 2924/10329* (2013.01); *H01L 2924/1203* (2013.01); *H01L 2924/1305* (2013.01); *H01L 2924/13055* (2013.01); *H01L 2924/13062* (2013.01); *H01L 2924/13091* (2013.01); *H01L 2924/16195* (2013.01); *H01L 2924/19107* (2013.01); *H01L 2224/40247* (2013.01); *H01L 23/3135* (2013.01); *H01L 24/29* (2013.01); *H01L 24/83* (2013.01); *H01L 2224/291* (2013.01); *H01L 2224/49175* (2013.01); *H01L 2224/83439* (2013.01); *H01L 2224/83444* (2013.01); *H01L 2224/83455* (2013.01); *H01L 2224/83464* (2013.01); *H01L 2224/8382* (2013.01); *H01L 2224/8384* (2013.01); *H01L 2924/01014* (2013.01); *H01L 2924/01028* (2013.01); *H01L 23/4006* (2013.01); *H01L 24/49* (2013.01); *H01L 2224/49111* (2013.01); *H01L 2224/4846* (2013.01); *H01L 2224/8584* (2013.01); *H01L 2224/293* (2013.01)

USPC .... 257/712; 257/734; 257/691; 257/E23.101; 257/E23.08; 438/122

(56) References Cited

U.S. PATENT DOCUMENTS

| | | |
|---|---|---|
| 2007/0013046 A1 | 1/2007 | Bayerer et al. |
| 2008/0079021 A1* | 4/2008 | Bayerer et al. ................. 257/177 |
| 2008/0128896 A1* | 6/2008 | Toh et al. ....................... 257/712 |
| 2008/0179972 A1 | 7/2008 | Aoki et al. |
| 2008/0290499 A1* | 11/2008 | Nishi et al. .................... 257/712 |
| 2009/0130825 A1 | 5/2009 | Nakamura et al. |
| 2010/0207263 A1 | 8/2010 | Niitin et al. |
| 2011/0053319 A1* | 3/2011 | Hohlfeld et al. .............. 438/121 |
| 2011/0070695 A1 | 3/2011 | Bayerer |
| 2011/0079376 A1 | 4/2011 | Loong et al. |
| 2011/0115068 A1* | 5/2011 | Hartung et al. ............... 257/690 |
| 2011/0139411 A1 | 6/2011 | Thors |

FOREIGN PATENT DOCUMENTS

| | | |
|---|---|---|
| DE | 102005033469 | 2/2007 |
| DE | 112008000040 | 10/2009 |
| JP | 09298259 | 11/1997 |
| WO | 9852221 | 11/1998 |

OTHER PUBLICATIONS

"Investigation on the Impact on Thermal Performances of New Pin and Fin Geometries Applied to Liquid Cooling of Power Electronics", Matt Reeves, et al., PCIM Europe 2011, May 17-19, 2011 (7 pgs.).

Office Action mailed Nov. 19, 2012 in U.S. Appl. No. 13/230,223.

Non-Final Office Action mailed Jan. 31, 2013 in U.S. Appl. No. 13/230,223.

Final Office Action mailed Mar. 27, 2013 in U.S. Appl. No. 13/230,223.

* cited by examiner

SEMICONDUCTOR DEVICE INCLUDING CLADDED BASE PLATE

CROSS-REFERENCE TO RELATED APPLICATIONS

This Utility Patent Application is a Continuation-in-Part of U.S. application Ser. No. 13/230,223, filed Sep. 12, 2011, which is incorporated herein by reference.

BACKGROUND

Power electronic modules are semiconductor packages that are used in power electronic circuits. Power electronic modules are typically used in vehicular and industrial applications, such as in inverters and rectifiers. The semiconductor components included within the power electronic modules are typically insulated gate bipolar transistor (IGBT) semiconductor chips or metal-oxide-semiconductor field effect transistor (MOSFET) semiconductor chips. The IGBT and MOSFET semiconductor chips have varying voltage and current ratings. The semiconductor components included within the power electronic modules may also include diodes, thyristors, junction gate field-effect transistors (JFETs), and bipolar transistors. Both passive components and control electronics may be included within the power electronic modules. The semiconductor components are made from Si, SiC, GaN, GaAs, or other suitable substrates. Some power electronic modules include additional semiconductor diodes (i.e., free-wheeling diodes) in the semiconductor package for over-voltage protection.

In general, two different power electronic module designs are used. One design is for higher power applications and the other design is for lower power applications. For higher power applications, a power electronic module typically includes several semiconductor chips integrated on a single substrate. The substrate typically includes an insulating ceramic substrate, such as $Al_2O_3$, AlN, $Si_3N_4$, or other suitable material, to insulate the power electronic module. At least the top side of the ceramic substrate is metallized with either pure or plated Cu, Al, or other suitable material to provide electrical and mechanical contacts for the semiconductor chips. The metal layer is typically bonded to the ceramic substrate using a direct copper bonding (DCB) process, a direct aluminum bonding process (DAB) process, or an active metal brazing (AMB) process.

Typically, soft soldering with Sn—Pb, Sn—Ag, Sn—Ag—Cu, or another suitable solder alloy is used for joining a semiconductor chip to a metallized ceramic substrate. Typically, several substrates are combined onto a planar metal base plate. In this case, the backside of the ceramic substrate is also metallized with either pure or plated Cu, Al, or other suitable material for joining the substrates to the planar metal base plate. To join the substrates to the planar metal base plate, soft soldering with Sn—Pb, Sn—Ag, Sn—Ag—Cu, or another suitable solder alloy is typically used. The planar metal base plate may in turn be attached to a cooling element through which a coolant may flow to prevent overheating of the power electronic module during operation.

With the increasing desire to use power electronics in harsh environments (e.g., automotive applications) and the ongoing integration of semiconductor chips, the externally and internally dissipated heat continues to increase. Therefore, there is a growing demand for high temperature power electronic modules capable of operating with internal and external temperatures up to and exceeding 200° C. In addition, the current density of power electronics continues to increase, which leads to an increase in the density of power losses. Therefore, liquid cooling of the power electronics via cooling elements to prevent overheating is becoming increasingly important.

For these and other reasons, there is a need for the present invention.

SUMMARY

One embodiment provides a semiconductor device. The semiconductor device includes a semiconductor chip joined with a substrate and a base plate joined with the substrate. The base plate includes a first metal layer clad to a second metal layer. The second metal layer is deformed to provide a pin-fin or fin cooling structure. The second metal layer has a sub-layer that has no pins and no pin-fins. The first metal has a first thickness and the sub-layer has a second thickness. The ratio between first thickness and the second thickness is at least 4:1.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the disclosure may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present disclosure. The following detailed description, therefore, is not to be taken in a limiting sense, and the scope of the present disclosure is defined by the appended claims.

It is to be understood that the features of the various exemplary embodiments described herein may be combined with each other, unless specifically noted otherwise.

As used herein, the term "electrically coupled" is not meant to mean that the elements must be directly coupled together and intervening elements may be provided between the "electrically coupled" elements.

Figure 1:
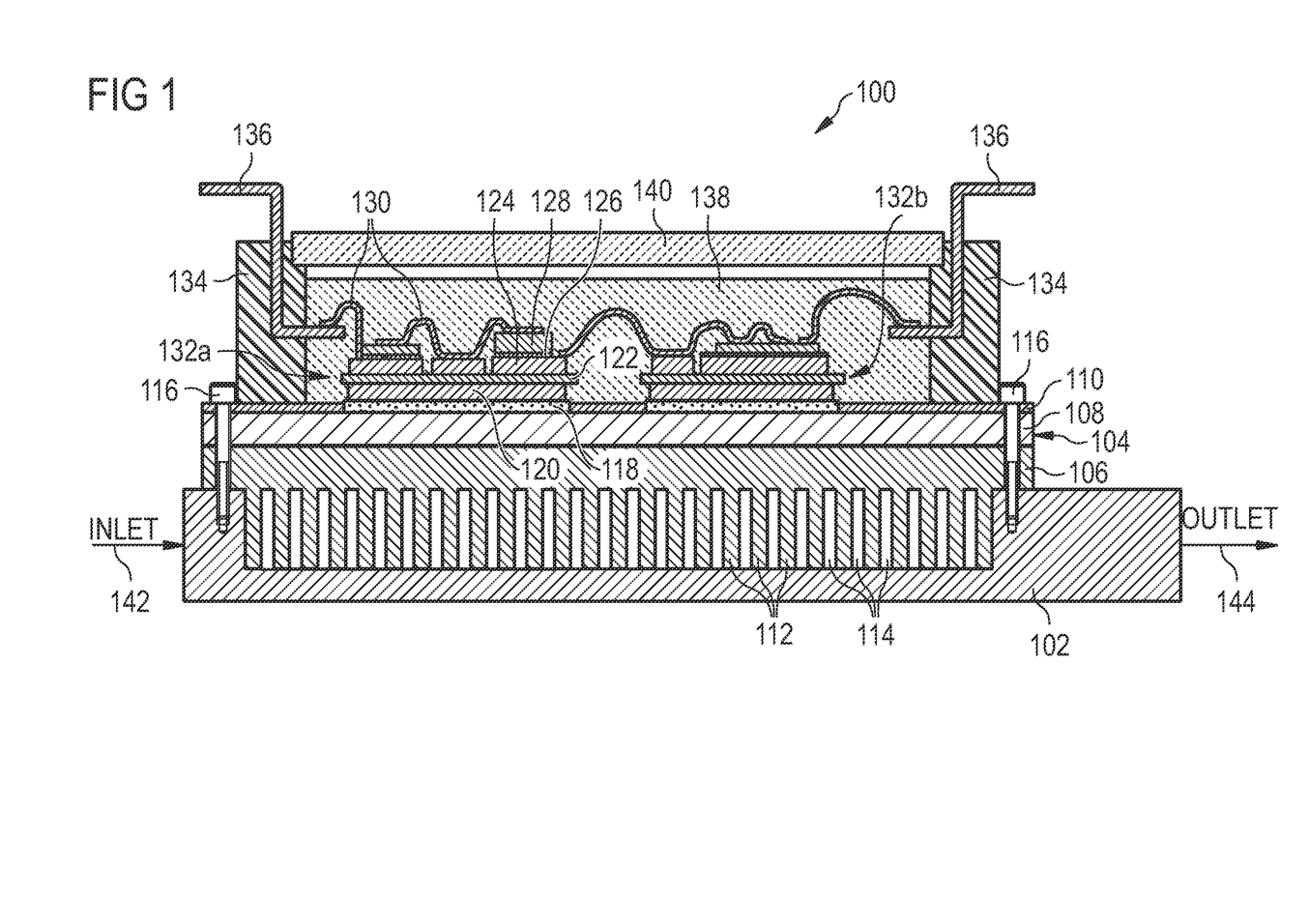
FIG. 1 illustrates a cross-sectional view of one embodiment of a semiconductor device.

FIG. 1 illustrates a cross-sectional view of one embodiment of a semiconductor device 100. In one embodiment, semiconductor device 100 is a high temperature (i.e., up to and exceeding 200° C.) high power electronic module. Power electronic module 100 includes a chamber 102 for receiving a cooling fluid, a base plate 104, joints 118, substrate assemblies 132a and 132b, frame 134, terminals 136, potting 138, and cap 140. Each substrate assembly 132a and 132b includes metallized ceramic substrates 122 including metal surfaces or layers 120 and 124, joints 126, semiconductor chips 128, and bond wires 130.

Base plate 104 includes a first metal layer 108 and a second metal layer 106. First metal layer 108 and second metal layer 106 are made of different materials. In one embodiment, first metal layer 108 is a copper layer or a copper alloy layer and second metal layer 106 is an aluminum layer or an aluminum alloy layer. In other embodiments, first metal layer 108 and second metal layer 106 are made of other suitable materials. In one embodiment, base plate 104 also includes a third metal layer 110 opposite second metal layer 106. Third metal layer 110 and first metal layer 108 are made of different materials. In one embodiment, third metal layer 110 is an aluminum layer or an aluminum alloy layer. In other embodiments, third metal layer 110 is a silver layer, a silver alloy layer, a palladium layer, a palladium alloy layer, or another suitable material layer. First metal layer 108 is clad to second metal layer 106. Third metal layer 110 is clad to first metal layer 108. Second metal layer 106 is structured to provide pin-fins or fins 112 and spaces 114 between pin-fins or fins 112.

Base plate 104 is formed from a bimetal or trimetal ribbon (i.e., a cladded strip). Base plate 104 provides a low cost base plate having good solderability on one side due to the first metal layer. In addition, base plate 104 includes cooling fins or pins on the other side that are compatible with a cooling fluid due to the second metal layer.

Chamber 102 for receiving a cooling fluid includes an inlet 142 and an outlet 144 for passing a cooling fluid through spaces 114 between pin-fins or fins 112 of base plate 104. Chamber 102 is joined with base plate 104 via screws 116. In other embodiments, screws 116 are not used and chamber 102 is glued or laser welded to base plate 104. Each substrate assembly 132a and 132b is joined with base plate 104 via joints 118. Joints 118 are soft soldered joints, sintered joints, diffusion soldered joints, or other suitable joints.

Ceramic substrates 122 include $Al_2O_3$, AlN, $Si_3N_4$, or other suitable material. In one embodiment, ceramic substrates 122 each have a thickness within a range of 0.2 mm to 2.0 mm. Metal layers 120 and 124 include Cu, Al, or another suitable material. In one embodiment, metal layers 120 and/or 124 are plated with one or more layers of Ni, Ag, Au, Pd. In one embodiment, metal layers 120 and 124 each have a thickness within a range of 0.1 mm to 0.6 mm. In one embodiment, metal layers 120 and 124 are bonded to ceramic substrate 122 using a direct copper bonding (DCB) process to provide a DCB substrate, a direct aluminum bonding process (DAB) process to provide a DAB substrate, or an active metal brazing (AMB) process to provide an AMB substrate. Joints 126 couple metal layers 124 to semiconductor chips 128. Joints 126 are soft soldered joints, sintered joints, diffusion soldered joints, or other suitable joints.

Semiconductor chips 128 are electrically joined with metal layers 124 through bond wires 130. In one embodiment, semiconductor chips 128 are power semiconductor chips and may include IGBTs, MOSFETs, JFETs, bipolar transistors, thyristors, diodes, and/or other suitable power components. Bond wires 130 include Al, Cu, Al—Mg, Au, or another suitable material. In one embodiment, bond wires 130 are bonded to semiconductor chips 128 and metal layers 124 using ultrasonic wire bonding. Metal layers 124 and/or semiconductor chips 128 are electrically coupled to terminals 136. Terminals 136 extend through frame 134 to provide external electrical connections to power electronic module 100 for both power and control connections.

Frame 134 encloses joints 118, substrate assemblies 132a and 132b, bond wires 130, and portions of terminals 136. Frame 134 includes technical plastics or another suitable material. Frame 134 is joined to base plate 104 via screwing, gluing, clamping, welding, or other suitable technique. Potting material 138 fills areas within frame 134 around joints 118, substrate assemblies 132a and 132b, bond wires 130, and portions of terminals 136. Potting material 138 includes silicone gel, a coating of silicone, a coating of polyimide, a coating of epoxy, or another suitable material for providing electrical isolation. Potting material 138 prevents damage to power electronic module 100 by dielectrical breakdown. Cap 140 is attached to frame 134 to cover substrate assemblies 132a and 132b and potting 138. In one embodiment, cap 104 is a second potting layer, such as epoxy or other suitable capping material. In another embodiment, cap 104 is a cover assembly that is attached to frame 134 via snap-in, welding, gluing, or other suitable technique.

The followings FIGS. 2-13 illustrate a process for fabricating a semiconductor device, such as semiconductor device 100 previously described and illustrated with reference to FIG. 1.

Figure 2:
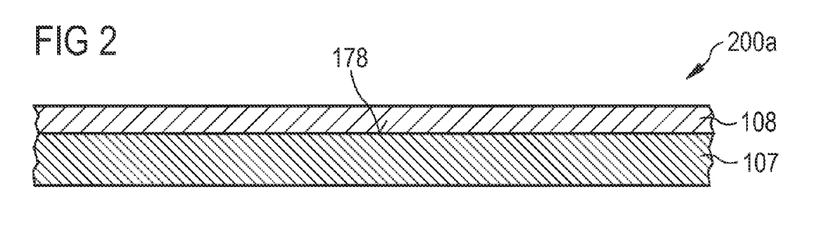
FIG. 2 illustrates a cross-sectional view of one embodiment of a bimetal ribbon (i.e. a bimetal clad strip).

FIG. 2 illustrates a cross-sectional view of one embodiment of a bimetal ribbon (i.e. a bimetal clad strip) 200a. Bimetal ribbon 200a includes a first metal layer 108 and a second metal layer 107. First metal layer 108 and second metal layer 107 are different materials. In one embodiment, first metal layer 108 is made of a solderable material and has, at 20° C., a coefficient of thermal expansion (CTE) of less than 18 ppm/K. Second metal layer 107 is selected to be easily machinable (e.g., shapeable, edgeable, and beadable).

In one embodiment, second metal layer 107 is chemically compatible with aluminum in liquid cooling circuits. In one embodiment, first metal layer 108 is a copper layer or a copper alloy layer and second metal layer 107 is an aluminum layer or an aluminum alloy layer. In other embodiments, first metal layer 108 and second metal layer 107 are other suitable metals.

In one embodiment, the total thickness of bimetal ribbon 200a is between 5 mm and 6 mm. In one embodiment, the thickness of first metal layer 108 is equal to the thickness of second metal layer 107. In one embodiment, the thickness of first metal layer 108 is between 2.5 mm and 3 mm and the thickness of second metal layer 107 is between 2.5 mm and 3 mm. In another embodiment, the thickness of first metal layer 108 is between 2.5 mm and 10 mm and the thickness of second metal layer 107 is between 2.5 mm and 10 mm. In other embodiments, the thickness of first metal layer 108 and the thickness of second metal layer 107 have other values suitable for forming a base plate.

First metal layer 108 is clad to second metal layer 107. In one embodiment, first metal layer 108 is clad to second metal layer 107 by bringing the separate layers together in the rolls of a cladding stand. Uniform pressure from the rolls compresses the individual layers to form a bond between the contact surfaces. The bonded layers are then subjected to recrystallization annealing and rolling to the finished size. After rolling to the finished size, the bonded layers are subjected to another heat treatment to inseparably fuse the layers together. In other embodiments, first metal layer 108 is clad to second metal layer 107 using another suitable technique.

Figure 3:
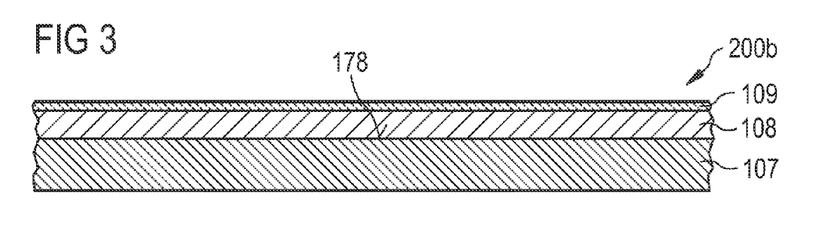
FIG. 3 illustrates a cross-sectional view of one embodiment of a trimetal ribbon (i.e. a trimetal clad strip).

FIG. 3 illustrates a cross-sectional view of one embodiment of a trimetal ribbon (i.e. a trimetal clad strip) 200b. Trimetal ribbon 200b includes first metal layer 108 and second metal layer 107, as previously described and illustrated with reference to FIG. 2, and a third metal layer 109. Third metal layer 109 and first metal layer 108 are different materials. In one embodiment, third metal layer 109 and second metal layer 107 are the same material. In one embodiment, third metal layer 109 is aluminum or an aluminum alloy. In other embodiments, third metal layer 109 is silver, a silver alloy, palladium, a palladium alloy, or another suitable metal. Third metal layer 109 has a thickness less than the thickness of first metal layer 108 and the thickness of second metal layer 107. In one embodiment, third metal layer 109 has a thickness between 1 μm and 0.1 mm. Third metal layer 109 is clad to first metal layer 108 opposite second metal layer 107 using a suitable technique such as the cladding process previously described with reference to FIG. 2.

While the followings FIGS. 4-13 illustrate the fabrication of a semiconductor device utilizing trimetal ribbon 200b previously described and illustrated with reference to FIG. 3, the illustrated process is also applicable to bimetal ribbon 200a previously described and illustrated with reference to FIG. 2.

Figure 4:
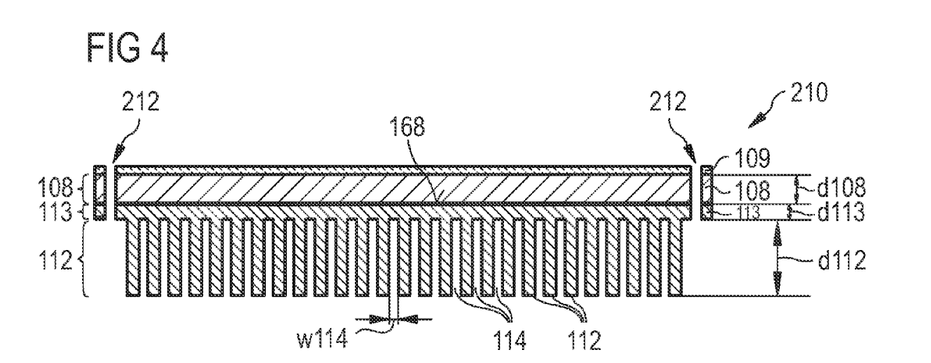
FIG. 4 illustrates a cross-sectional view of one embodiment of a base plate including a cooling structure.

FIG. 4 illustrates a cross-sectional view of one embodiment of a base plate 210 including a cooling structure. Second metal layer 107 of base plate 200b previously described and illustrated with reference to FIG. 3 is structured to form a cooling structure having pin-fins or fin 112 with spaces 114 between the pin-fins or fins 112. Second metal layer 107 is deformed via cutting, stamping, or micro deformation technology (MDT) to provide the second metal layer 106. MDT mechanically and plastically deforms second metal layer 107 to form pin-fins or fins 112 without removing any metal. Second metal layer 107 is deformed such that no portion of the surface of first metal layer 108 facing second metal layer 106 is exposed. By not exposing the surface of first metal layer 108, first metal layer 108 is protected from corrosion.

In one embodiment, pin-fins or fins 112 are formed by MDT, pressure casting, or coining to provide pin-fins or fins 112 having a length between 5.5 mm and 6.0 mm. In another embodiment, pin-fins or fins 112 are formed by MDT to provide pin-fins or fins 112 having a length d112 between 2 mm and 10 mm and spaces 114 having a width w115 between 1 mm and 10 mm. In another embodiment, pin-fins or fins 112 are formed by pressure casting or coining to provide pin-fins or fins 112 having a length d112 between 2 mm and 20 mm and spaces 114 having a width w115 between 1 mm and 20 mm. In other embodiments, pin-fins or fins 112 are formed to have other suitable lengths. In one embodiment, holes 212 are cut or stamped through base plate 210 for mounting base plate 210 to other device structures, such as a chamber 102 for receiving a cooling fluid previously described and illustrated with reference to FIG. 1.

As illustrated in FIG. 4, the second metal layer 106 may include a sub-layer 113 that has no pins and no pin-fins 112. In a direction perpendicular to the interface 168 between the first and second metal layer 108, 106, the sub-layer 113 has a thickness d113. In one embodiment, the thickness d113 may be in a range from 0.2 mm to 0.5 mm. Alternatively or in addition, the ratio between the thickness d108 of the first metal layer 108 and the thickness d113 of the sub-layer 113 may be at least 4:1, or at least 10:1.

Generally, the material and the thickness of the first metal layer 108 and the material, the thickness and the structure of the second metal layer 106 and the sub-layer 113 may be chosen such that the composite of the first metal layer 108 and the second metal layer 106 including the sub-layer 113 and the pin-fins or fins 112 has, in each direction parallel to the interface 168 between the first and second metal layer 108, 106, a CTE of less than or equal to 18 ppm/K, or even of less than 17 ppm/K.

Figure 5:
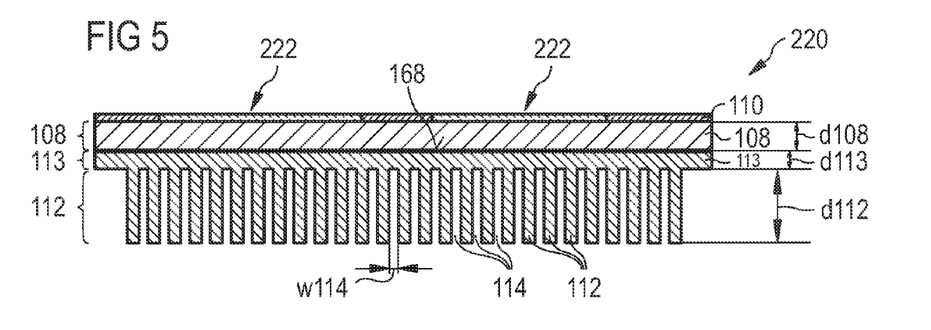
FIG. 5 illustrates a cross-sectional view of another embodiment of a base plate including a cooling structure.

FIG. 5 illustrates a cross-sectional view of another embodiment of a base plate 220 including a cooling structure. Base plate 220 is similar to base plate 210 previously described and illustrated with reference to FIG. 4 except that base plate 220 excludes holes 212 and third metal layer 109 has been structured to provide third metal layer 110. Portions of third metal layer 109 are etched, scratched, peeled, or removed using another suitable technique to expose portions 222 of first metal layer 108 and to provide third metal layer 110. Third metal layer 109 may be structured to provide third metal layer 110 prior to or after the forming of pin-fins or fins 112. In one embodiment, first metal layer 108 includes copper and the structuring of the third metal layer prepares base plate 220 for soldering on the first metal layer. In one embodiment, third metal layer 110 includes aluminum and provides a solder mask and a solder stop.

Figure 6:
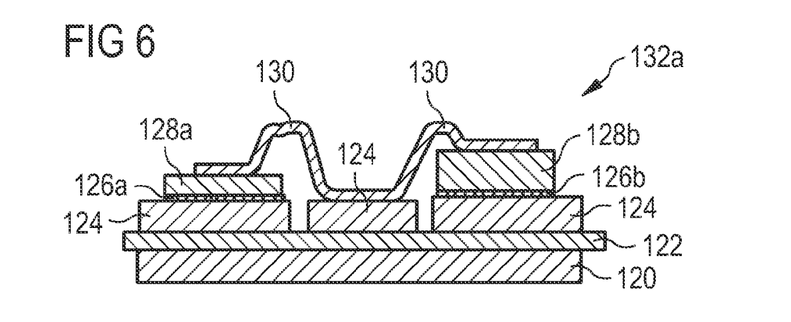
FIG. 6 illustrates a cross-sectional view of one embodiment of a substrate assembly.

FIG. 6 illustrates a cross-sectional view of one embodiment of a substrate assembly 132a. Substrate assembly 132a includes metallized ceramic substrates 122 including metal surfaces or layers 120 and 124, joints 126a and 126b, semiconductor chips 128a and 128b, and bond wires 130. A first semiconductor chip 128a is attached to metal layer 124 via a first joint 126a. A second semiconductor chip 128b is attached to metal layer 124 via a second joint 126b. Joints 126a and 126b are soft soldered joints, sintered joints, diffusion soldered joints, or other suitable joints.

Semiconductor chips 128a and 128b are electrically joined with metal layer 124 through bond wires 130. In one embodiment, semiconductor chips 128a and 128b are power semiconductor chips and may include IGBTs, MOSFETs, JFETs, bipolar transistors, thyristors, diodes, and/or other suitable power components. Bond wires 130 include Al, Cu, Al—Mg, Au, or another suitable material. In one embodiment, bond wires 130 are bonded to semiconductor chips 128a and 128b and metal layers 124 using ultrasonic wire bonding. In other embodiments, clips or copper strips and sintering are used to electrically couple semiconductor chips 128a and 128b to metal layer 124. Other substrate assemblies, such as substrate assembly 132b previously described and illustrated with reference to FIG. 1 may also be fabricated.

Figure 7:
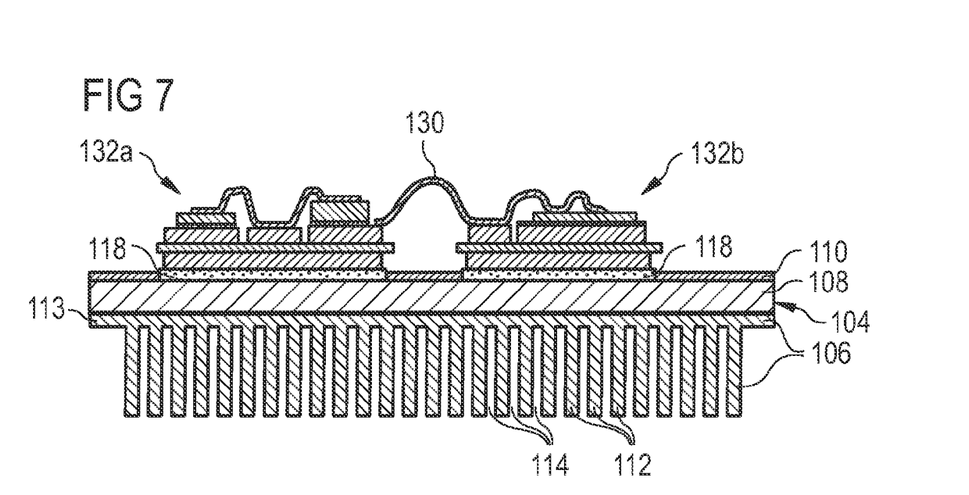
FIG. 7 illustrates a cross-sectional view of one embodiment substrate assemblies joined with a base plate.

FIG. 7 illustrates a cross-sectional view of one embodiment of substrate assemblies 132a and 132b joined with a base plate 104. Substrate assemblies 132a and 132b are joined with first metal layer 108 via joints 118. In other embodiments, substrate assemblies 132a and 132b are fabricated on base plate 104. In one embodiment, substrate assemblies 132a and 132b are soft soldered to first metal layer 108 to provide solder joints 118. Solder joints 118 include Sn—Pb, Sn—Ag, Sn—Ag—Cu, Sn—Sb, or another suitable solder alloy. In one embodiment, first metal layer 108 includes copper or a copper alloy and third metal layer 110 includes aluminum or an aluminum alloy and provides a solder mask and a solder stop for the soldering process.

In another embodiment, substrate assemblies 132a and 132b are diffusion soldered to first metal layer 108 to provide diffusion soldered joints 118. During the diffusion soldering process, soft solder is completely solidified to provide a pure intermetallic joint (e.g., $Cu_3Sn$, $Cu_6Sn_5$, $Ag_3Sn$) after the diffusion soldering process. In another embodiment, substrate assemblies 132a and 132b are sintered to first metal layer 108 to provide sintered joints 118. Each sintered joint 118 is a sintered metal layer including sintered nanoparticles, such as Ag nanoparticles, Au nanoparticles, Cu nanoparticles, or other suitable nanoparticles. Substrate assembly 132a is electrically joined with substrate assembly 132b via bond wires 130.

Figure 8:
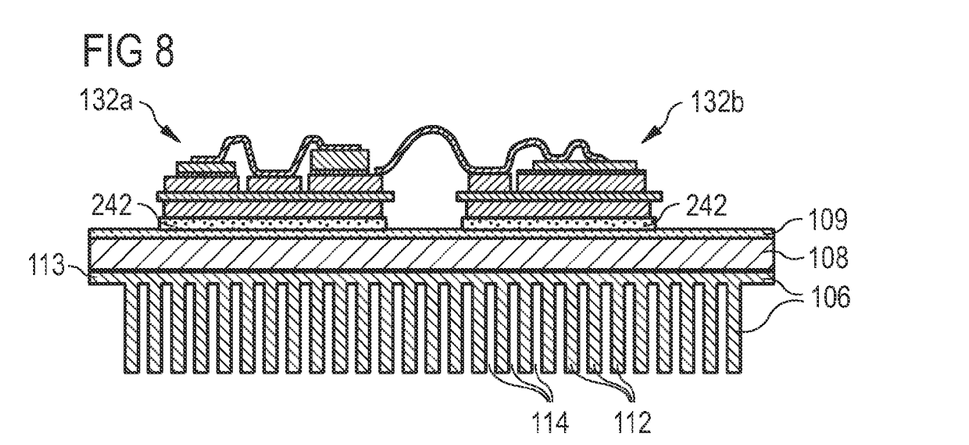
FIG. 8 illustrates a cross-sectional view of another embodiment of substrate assemblies joined with a base plate.

FIG. 8 illustrates a cross-sectional view of another embodiment of substrate assemblies 132a and 132b joined with a base plate including third metal layer 109. In this embodiment, third metal layer 109 has not been structured to expose first metal layer 108. Substrate assemblies 132a and 132b are soft soldered, diffusion soldered, or sintered to third metal layer 109 to provide joints 242. In one embodiment, third metal layer 109 includes silver, a silver alloy, palladium, or a palladium alloy. Third metal layer 109 may provide an interface for sintering or diffusion soldering.

While the following FIGS. 9-13 include joints 118 joining substrate assemblies 132a and 132b to first metal layer 108, the embodiments are also applicable when utilizing joints 242 joining substrate assemblies 132a and 132b to third metal layer 109.

Figure 9:
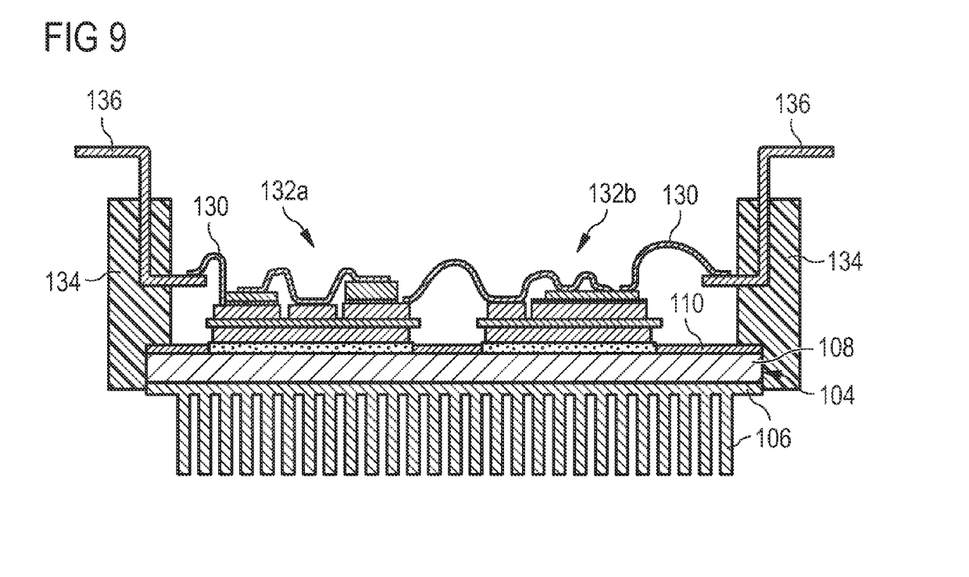
FIG. 9 illustrates a cross-sectional view of one embodiment of the substrate assemblies, the base plate, terminals, and a frame.

FIG. 9 illustrates a cross-sectional view of one embodiment of the substrate assemblies 132a and 132b, the base plate 104, terminals 136, and a frame 134. Frame 134 is attached to base plate 104 via screwing, gluing, clamping, welding, or other suitable method. In one embodiment, frame 134 contacts the upper surface of third metal layer 110 and the sidewalls of first metal layer 108, second metal layer 106, and third metal layer 110. In other embodiments (e.g., FIG. 1), frame 134 only contacts the upper surface of third metal layer 110 or first metal layer 108 (i.e., if third metal layer 110 is excluded).

Terminals 136 are inserted or formed through frame 134 such that a portion of the terminals 136 extend outside frame 134 for electrical power and control connections. A portion of terminals 136 extend into frame 134 for internal electrical connections to substrate assemblies 132a and 132b. Terminals 136 are electrically joined with substrate assemblies 132a and 132b via bond wires 130. In other embodiments, terminals 136 are directly electrically coupled to substrate assemblies 132a and 132b via welding or another suitable technique.

Figure 10:
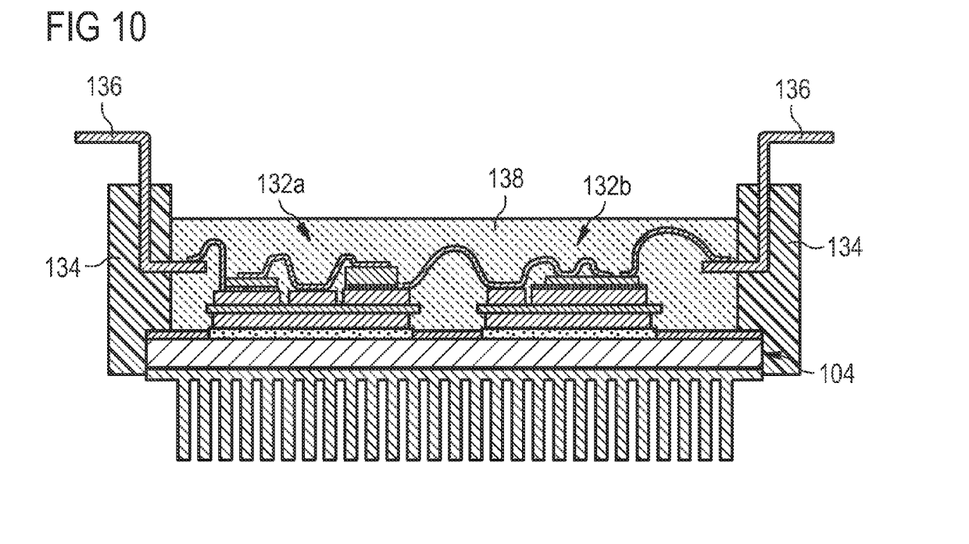
FIG. 10 illustrates a cross-sectional view of one embodiment of the substrate assemblies, the base plate, the terminals, the frame, and potting material.

FIG. 10 illustrates a cross-sectional view of one embodiment of the substrate assemblies 132a and 132b, the base plate 104, the terminals 136, the frame 134, and potting material 138. In one embodiment, a silicone gel is applied over substrate assemblies 132a and 132b within frame 134 to provide potting 138. In other embodiments, substrate assemblies 132a and 132b are coated with silicone, polymide, epoxy, or other suitable material to provide electrical isolation.

Figure 11:
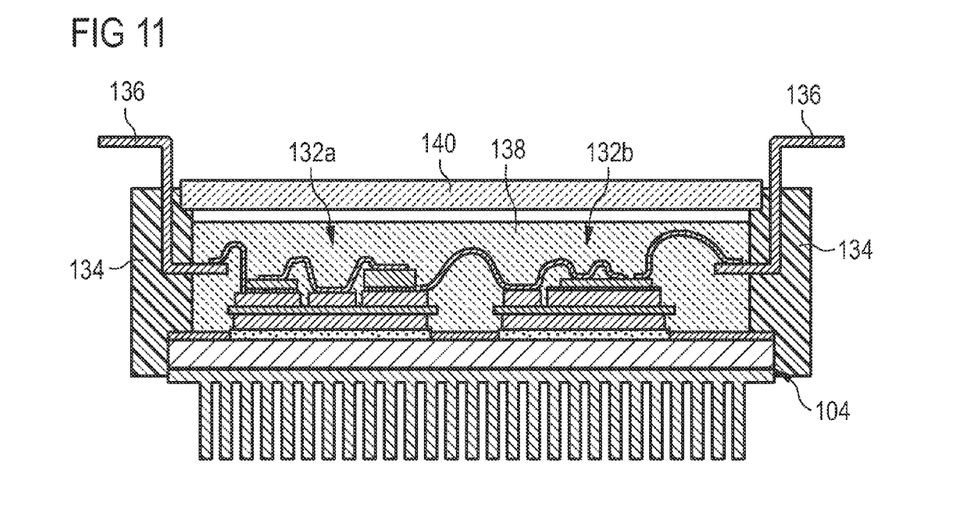
FIG. 11 illustrates a cross-sectional view of one embodiment of the substrate assemblies, the base plate, the terminals, the frame, the potting material, and a cap.

FIG. 11 illustrates a cross-sectional view of one embodiment of the substrate assemblies 132a and 132b, the base plate 104, the terminals 136, the frame 134, the potting material 138, and a cap 140. In one embodiment, a second potting material, such as epoxy, is applied over potting 138 to provide cap 140. In another embodiment, a cover assembly is attached to frame 134 via snap-in, welding, gluing, or another suitable method to provide cap 140.

Figure 12:
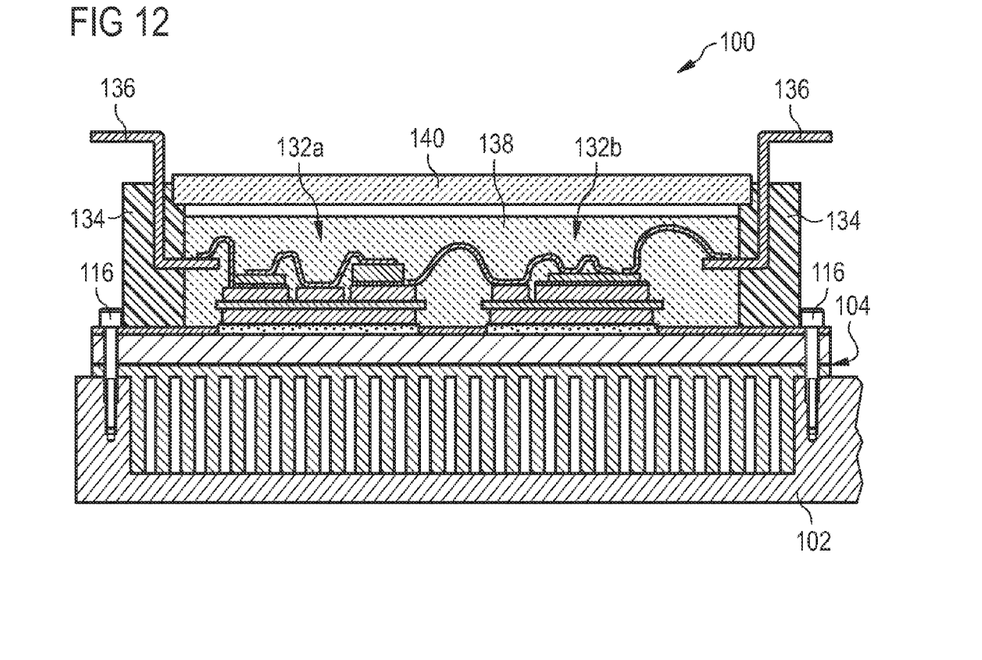
FIG. 12 illustrates a cross-sectional view of one embodiment of a semiconductor device including a chamber for receiving a cooling fluid.

FIG. 12 illustrates a cross-sectional view of one embodiment of a semiconductor device 100 including a chamber 102 for receiving a cooling fluid. Chamber 102 is attached to base plate 104 via screws 116. In other embodiments, chamber 102 is attached to base plate 104 via gluing, welding, or another suitable method. In one embodiment, chamber 102 is made from aluminum or an aluminum alloy. In other embodiments, chamber 102 is made from another suitable material compatible with the cooling fluid. Chamber 102 includes an inlet and an outlet. In one embodiment, chamber 102 guides cooling fluid to hot areas in an optimum way to compensate for minor differences in junction temperatures of paralleled or different semiconductor chips.

Figure 13:
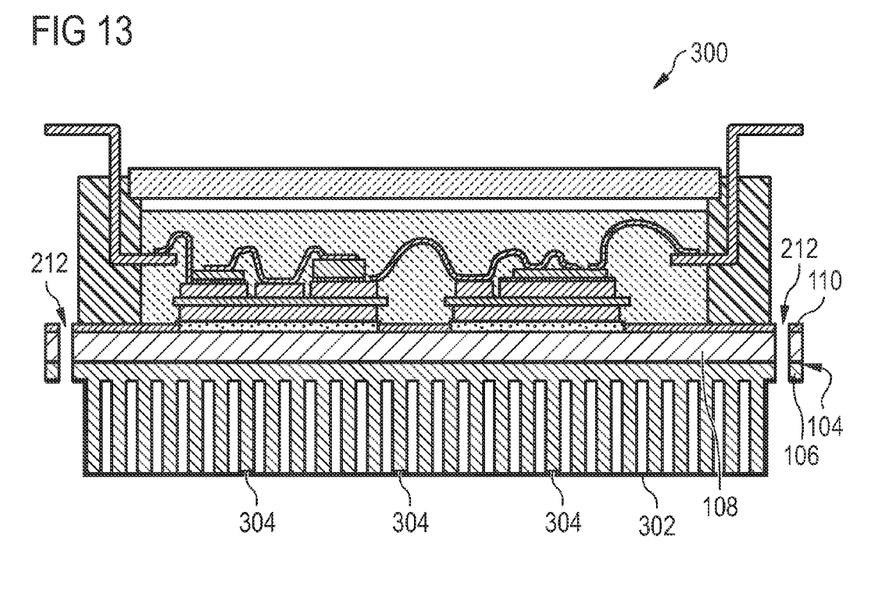
FIG. 13 illustrates a cross-sectional view of another embodiment of a semiconductor device including a chamber for receiving a cooling fluid.

FIG. 13 illustrates a cross-sectional view of another embodiment of a semiconductor device 300 including a chamber 302 for receiving a cooling fluid. In this embodiment, chamber 302 is fabricated by laser welding or gluing a thin metal layer to second metal layer 106 of base plate 104. The thin metal layer is glued or laser welded to second metal layer 106 at a plurality of points as indicated for example at 304. The location of connection points 304 may be selected to adjust the pressure and/or flow of the cooling fluid through the chamber. In one embodiment, the thin metal layer is aluminum or an aluminum alloy. In other embodiments, the thin metal layer is another suitable material that is compatible with the cooling fluid. Semiconductor device 300 also includes holes 212 that extend through base plate 104 and chamber 302. Holes 212 may be used to attach semiconductor device 300 to another structure.

Figure 14:
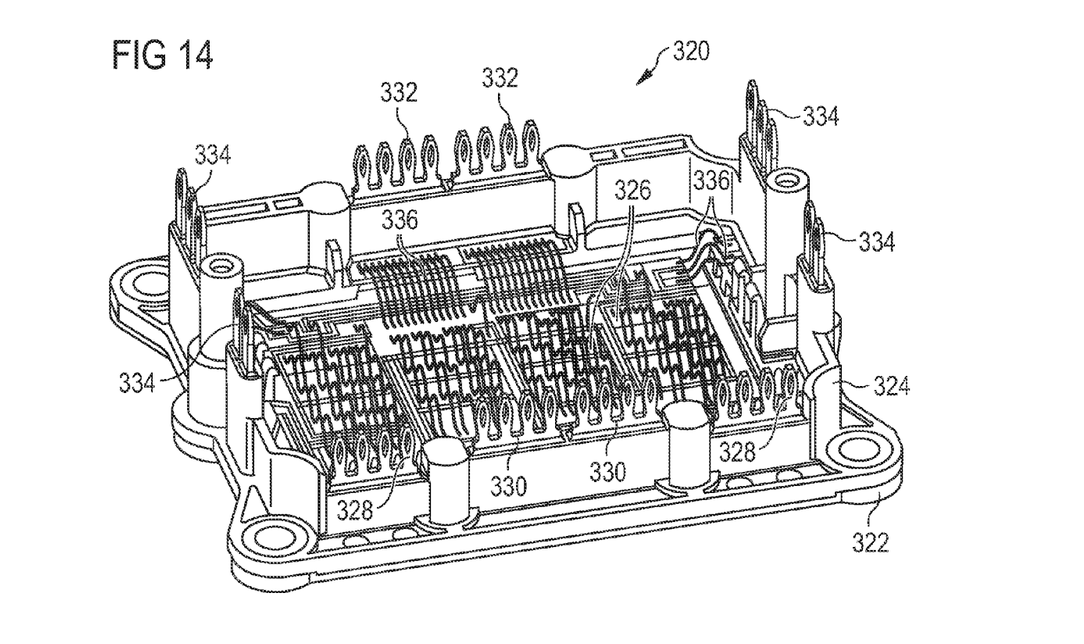
FIG. 14 illustrates a perspective view of another embodiment of a semiconductor device.

FIG. 14 illustrates a perspective view of another embodiment of a semiconductor device 320. In one embodiment, semiconductor device 320 is a high power electronic module. Power electronic module 320 includes a base plate 322, a frame 324, power semiconductor chips 326, power terminals 328, 330, and 332, and control terminals 334. In one embodiment, power terminals 228 are negative terminals, power terminals 330 are positive terminals, and power terminals 332 are phase output terminals.

Terminals 238, 330, 332, and 334 are electrically coupled to power semiconductor chips 326 via bond wires 336. Terminals 328, 330, 332, and 334 are pressfit-pins each having the same dimensions such that a single terminal type is used for all terminals of power electronic module 320. In addition, terminals 328, 330, 332, and 334 extend through frame 324 around the periphery of power electronic module 320. In one embodiment, base plate 322 is similar to base plate 104 previously described and illustrated with reference to FIG. 1.

Figure 15:
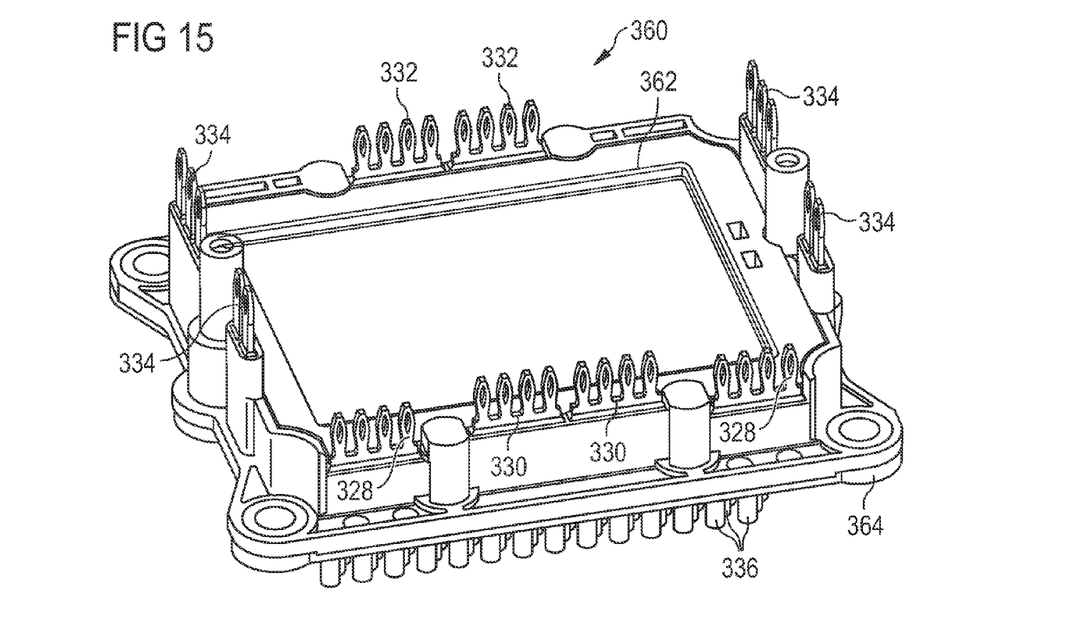
FIG. 15 illustrates a perspective view of another embodiment of a semiconductor device.

FIG. 15 illustrates a perspective view of another embodiment of a semiconductor device 360. Semiconductor device 360 is similar to semiconductor device 320 previously described and illustrated with reference to FIG. 14 except that semiconductor device 360 includes a cap 362 and base plate 322 has been replaced with base plate 364. Cap 362 is a snap-in cap. Base plate 364 includes pin-fins 366. In one embodiment, base plate 364 is similar to base plate 104 previously described and illustrated with reference to FIG. 1.

Figure 16:
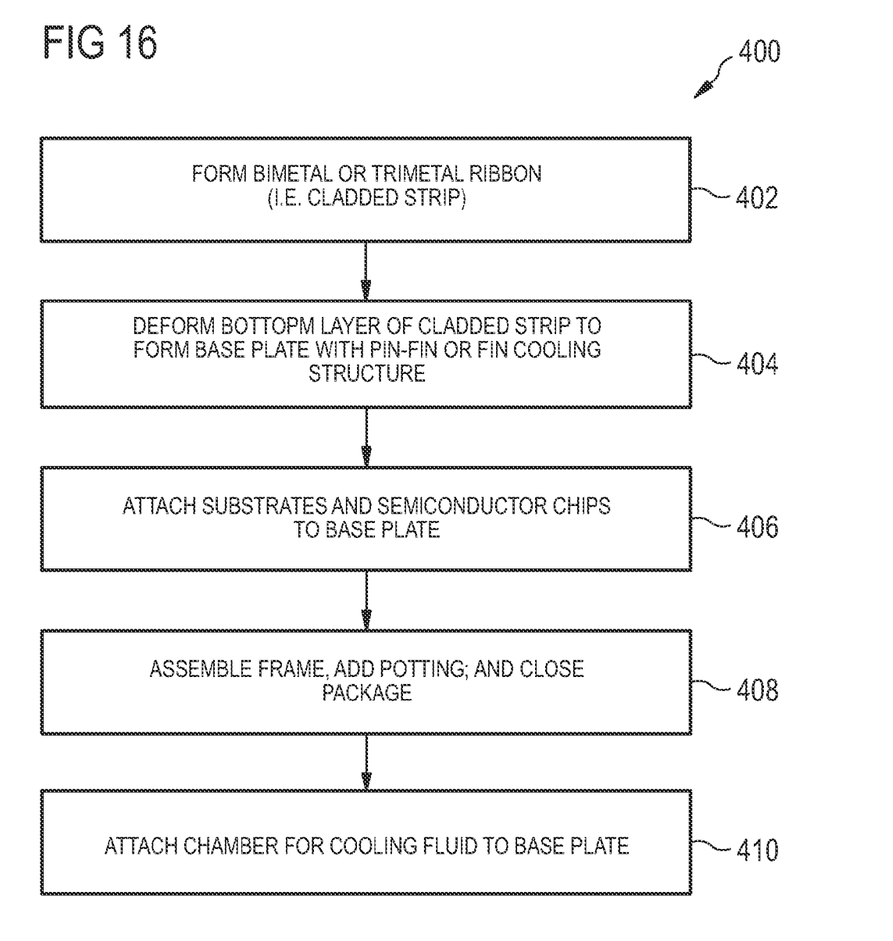
FIG. 16 is a flow diagram illustrating one embodiment of a method for fabricating a semiconductor device.

FIG. 16 is a flow diagram illustrating one embodiment of a method 400 for fabricating a semiconductor device, such as semiconductor device 100 previously described and illustrated with reference to FIGS. 1 and 12 or semiconductor device 300 previously described and illustrated with reference to FIG. 13. At 402, a bimetal or trimetal ribbon (i.e., a cladded strip) is formed (e.g., as previously described and illustrated with reference to FIGS. 2 and 3). At 404, the bottom layer of the cladded strip is deformed to form a base plate with a pin-fin or fin cooling structure (e.g., as previously described and illustrated with reference to FIG. 4). At 406, substrates and semiconductor chips (e.g., substrate assemblies or separate components) are attached to the base plate (e.g., as previously described and illustrated with reference to FIG. 7). At 408, the frame is assembled, potting is added, and the package is closed (e.g., as previously described and illustrated with reference to FIGS. 9-11). At 410, a chamber for receiving a cooling fluid is attached to the base plate (e.g., as previously described and illustrated with reference to FIGS. 12 and 13).

Embodiments provide a semiconductor device including a cladded bimetal or trimetal base plate including a cooling structure. The cladded base plate provides a low cost solution for providing a base plate including a first metal layer suitable for joining to substrate assemblies and a second metal layer suitable for forming a cooling structure that is compatible with cooling fluids. In addition, the bond between the clad layers is significantly stronger than other technologies such as cold gas spray or bimetallic extrusion.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. A semiconductor device comprising:
a semiconductor chip joined with a substrate;
a base plate joined with the substrate, the base plate comprising a first metal layer directly clad to a second metal layer, the second metal layer deformed to provide a pin-fin or fin cooling structure, wherein
the second metal layer comprises a sub-layer that has no pins and no pin-fins;
the first metal layer comprises a first thickness;
the sub-layer comprises a second thickness;
the ratio between the first thickness and the second thickness is at least 4:1; and
the first metal layer comprises a first material and the second metal layer comprises a second material different from the first material.

2. The semiconductor device of claim 1, wherein the ratio between the first thickness and the second thickness is at least 10:1.

3. The semiconductor device of claim 1, wherein the second thickness is between 0.2 mm and 0.5 mm.

4. The semiconductor device of claim 1, wherein the first metal layer comprises copper and the second metal layer comprises aluminum.

5. The semiconductor device of claim 1, wherein the first metal layer has a thickness between 2.5 mm and 10 mm.

6. The semiconductor device of claim 1, further comprising:
a third metal layer clad to the first metal layer opposite the second metal layer.

7. The semiconductor device of claim 6, wherein the third metal layer has a thickness between 1 μm and 0.1 mm.

8. The semiconductor device of claim 6, wherein the third metal layer comprises one of silver and palladium.

9. The semiconductor device of claim 6, wherein the substrate is one of diffusion soldered and sintered to the third metal layer.

10. The semiconductor device of claim 6, wherein the third metal layer comprises aluminum.

11. The semiconductor device of claim 10, wherein
the third metal layer is structured to provide a solder stop layer; and
wherein the substrate is soldered to the first metal layer.

12. The semiconductor device of claim 1, wherein the first metal layer and the second metal layer including the sub-layer and the pin-fins or fins form a composite that has, in each direction parallel to an interface between the first metal layer and the second metal layer, at 20° C. a coefficient of thermal expansion of less than or equal to 18 ppm/K.

13. A semiconductor device comprising:
a first metallized ceramic substrate;
a first semiconductor chip joined with a first side of the first metallized ceramic substrate; and
a base plate joined with a second side of the first metallized ceramic substrate, the second side opposite the first side, the base plate comprising a first layer comprising copper directly clad to a second layer comprising aluminum, the second layer deformed to provide a pin-fin or fin cooling structure, wherein
the second metal layer comprises a sub-layer that has no pins and no pin-fins;
the first metal layer comprises a first thickness;
the sub-layer comprises a second thickness; and
the ratio between the first thickness and the second thickness is at least 4:1.

14. The semiconductor device of claim 13, wherein the first metal layer and the second metal layer including the sub-layer and the pin-fins or fins form a composite that has, in each direction parallel to an interface between the first metal layer and the second metal layer, at 20° C. a coefficient of thermal expansion of less than or equal to 18 ppm/K.

15. The semiconductor device of claim 13, wherein the ratio between the first thickness and the second thickness is at least 10:1.

16. The semiconductor device of claim 13, wherein the second thickness is between 0.2 mm and 0.5 mm.

17. The semiconductor device of claim 13, further comprising:
a second semiconductor chip joined with the first side of the first metallized ceramic substrate.

18. The semiconductor device of claim 13, wherein the base plate is joined with a second metallized ceramic substrate.

19. The semiconductor device of claim 13, further comprising:
- a chamber for receiving a cooling fluid, the chamber including an inlet and an outlet, the chamber surrounding the cooling structure;
- a frame attached to the base plate;
- potting surrounding the first semiconductor chip and the first metallized ceramic substrate; and
- a cap over the potting.

20. The semiconductor device of claim 13, further comprising:
- a power terminal electrically coupled to the first semiconductor chip; and
- a control terminal electrically coupled to the first semiconductor chip,
- wherein the power terminal and the control terminal have the same dimensions.

21. A method for fabricating a semiconductor device, the method comprising:
- providing a cladded strip comprising a first metal layer directly clad to a second metal layer, the first metal layer comprising a first material and the second metal layer comprising a second material different from the first material;
- structuring the second metal layer to form a pin-fin or fin cooling structure;
- joining a semiconductor chip with a substrate; and
- joining the substrate with the first metal layer; wherein
  - the second metal layer comprises a sub-layer that has no pins and no pin-fins;
  - the first metal layer comprises a first thickness;
  - the sub-layer comprises a second thickness; and
  - the ratio between the first thickness and the second thickness is at least 4:1.

22. The method of claim 21, wherein the first metal layer and the second metal layer including the sub-layer and the pin-fins or fins form a composite that has, in each direction parallel to an interface between the first metal layer and the second metal layer, at 20° C. a coefficient of thermal expansion of less than or equal to 18 ppm/K.

23. The method of claim 21, wherein the ratio between the first thickness and the second thickness is at least 10:1.

24. The method of claim 21, wherein the second thickness is between 0.2 mm and 0.5 mm.

25. The method of claim 21, wherein providing the cladded strip comprises providing the cladded strip comprising the first metal layer comprising copper and the second metal layer comprising aluminum.

26. The method of claim 21, wherein providing the cladded strip comprises providing the cladded strip comprising the first metal layer having a thickness between 2.5 mm and 10 mm.

27. The method of claim 21, wherein structuring the second metal layer comprises one of stamping the second metal layer, cutting the second metal layer, and mechanically and plastically deforming the second metal layer.

28. A method for fabricating a semiconductor device, the method comprising:
- providing a cladded strip comprising a first metal layer comprising copper directly clad to a second metal layer comprising aluminum;
- structuring the second metal layer to form a pin-fin or fin cooling structure;
- joining a semiconductor chip with a first side of a metallized ceramic substrate;
- joining a second side of the metallized ceramic substrate with the first metal layer, the second side opposite the first side; wherein
  - the second metal layer comprises a sub-layer that has no pins and no pin-fins;
  - the first metal layer comprises a first thickness;
  - the sub-layer comprises a second thickness; and
  - the ratio between the first thickness and the second thickness is at least 4:1.

29. The method of claim 28, wherein the first metal layer and the second metal layer including the sub-layer and the pin-fins or fins form a composite that has, in each direction parallel to an interface between the first metal layer and the second metal layer, at 20° C. a coefficient of thermal expansion of less than or equal to 18 ppm/K.

30. The method of claim 28, wherein the ratio between the first thickness and the second thickness is at least 10:1.

31. The method of claim 28, wherein the second thickness is between 0.2 mm and 0.5 mm.

32. The method of claim 28, wherein providing the cladded strip comprises at least one of providing the first metal layer comprising a copper alloy and providing the second metal layer comprising an aluminum alloy.

33. The method of claim 28, wherein providing the cladded strip comprises providing the cladded strip comprising a third metal layer clad to the first metal layer opposite the second metal layer.

34. The method of claim 33, further comprising:
- structuring the third metal layer to expose portions of the first metal layer; and
- wherein joining the second side of the metallized ceramic substrate with the first metal layer comprises soldering the second side of the metallized ceramic substrate to the first metal layer.

35. The method of claim 33, wherein joining the second side of the metallized ceramic substrate with the first metal layer comprises one of diffusion soldering and sintering the second side of the metallized ceramic substrate to the third metal layer.

* * * * *